(12) United States Patent
Hsu et al.

(10) Patent No.: US 10,109,531 B1
(45) Date of Patent: Oct. 23, 2018

(54) SEMICONDUCTOR STRUCTURE HAVING A BUMP LOWER THAN A SUBSTRATE BASE AND A WIDTH OF THE BUMP LARGER THAN A WIDTH OF FIN SHAPED STRUCTURES, AND MANUFACTURING METHOD THEREOF

(71) Applicant: UNITED MICROELECTRONICS CORP., Hsin-Chu (TW)

(72) Inventors: Te-Chang Hsu, Tainan (TW); An-Chi Liu, Tainan (TW); Nan-Yuan Huang, Tainan (TW); Yu-Chih Su, Tainan (TW); Cheng-Pu Chiu, New Taipei (TW); Tien-Shan Hsu, Tainan (TW); Chih-Yi Wang, Tainan (TW); Chi-Hsuan Cheng, Kaoshiung (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 15/616,936

(22) Filed: Jun. 8, 2017

(51) Int. Cl.
*H01L 21/8234* (2006.01)
*H01L 21/308* (2006.01)
*H01L 21/762* (2006.01)

(52) U.S. Cl.
CPC .. *H01L 21/823481* (2013.01); *H01L 21/3085* (2013.01); *H01L 21/76224* (2013.01); *H01L 21/823431* (2013.01)

(58) Field of Classification Search
CPC .......... H01L 21/3085; H01L 21/76224; H01L 21/823431; H01L 21/823481
See application file for complete search history.

(56) References Cited

U.S. PATENT DOCUMENTS

| 9,515,184 | B2* | 12/2016 | Chiang | ................. H01L 29/785 |
| 9,530,868 | B2 | 12/2016 | Huang | |
| 9,607,985 | B1 | 3/2017 | Tseng | |
| 9,911,658 | B2* | 3/2018 | Chiang | ................. H01L 29/785 |
| 2017/0084494 | A1 | 3/2017 | Chiang | |

* cited by examiner

*Primary Examiner* — Andrew Q Tran
(74) *Attorney, Agent, or Firm* — Winston Hsu

(57) ABSTRACT

A semiconductor structure includes a substrate, a plurality of fin shaped structures, a trench, and a first bump. The substrate has a base, and the fin shaped structures protrude from the base. The trench is recessed from the base of the substrate. The first bump is disposed within the trench and protrudes from a bottom surface of the trench. A topmost portion of the first bump is lower than the base, and a width of the first bump is larger than a width of each of the fin shaped structures.

20 Claims, 6 Drawing Sheets

SEMICONDUCTOR STRUCTURE HAVING A BUMP LOWER THAN A SUBSTRATE BASE AND A WIDTH OF THE BUMP LARGER THAN A WIDTH OF FIN SHAPED STRUCTURES, AND MANUFACTURING METHOD THEREOF

BACKGROUND OF THE INVENTION

1. Field of the Invention

The present invention relates to a semiconductor structure and a manufacturing method thereof, and more particularly, to a semiconductor structure including fin shaped structures and a manufacturing method thereof.

2. Description of the Prior Art

The conventional planar metal-oxide-semiconductor (hereinafter abbreviated as MOS) transistor has difficulty when scaling down to 65 nm and below. Therefore, the non-planar transistor technology such as fin type field effect transistor (hereinafter abbreviated as FinFET) technology that allows smaller size and higher performance is developed to replace the planar MOS transistor. For example, dual-gate FinFET device, tri-gate FinFET device, and omega-FinFET device have been provided. Since the three-dimensional structure of a FinFET increases the overlapping area between the gate and the fin-shaped structure of the silicon substrate, the channel region can therefore be controlled more effectively. Accordingly, the drain-induced barrier lowering (DIBL) effect and the short channel effect may be reduced.

However, layout designs of the FinFET structures still face some issues in conventional FinFET fabrication. Hence, how to improve the current FinFET fabrication and structure for resolving such issue has become an important task in the related field.

SUMMARY OF THE INVENTION

It is one of the objectives of the present invention to provide a semiconductor structure and a manufacturing method thereof. In the manufacturing method of the semiconductor structure, fin shaped structures in a predetermined region are removed for forming a trench recessed from a base of a substrate and a first bump protruding from a bottom surface of the trench for forming a more reliable semiconductor structure.

A semiconductor structure is provided in an embodiment of the present invention. The semiconductor structure includes a substrate, a plurality of fin shaped structures, a trench, and a first bump. The substrate has a base, and the fin shaped structures protrude from the base. The trench is recessed from the base of the substrate. The first bump is disposed within the trench and protrudes from a bottom surface of the trench. A topmost portion of the first bump is lower than the base, and a width of the first bump is larger than a width of each of the fin shaped structures.

A manufacturing method of a semiconductor structure is provided in an embodiment of the present invention. The manufacturing method includes the following steps. A substrate having a base and a plurality of fin shaped structures formed on the base are provided. The fin shaped structures in a predetermined region are removed for forming a trench and a first bump. The trench is recessed from the base of the substrate, and the first bump is formed within the trench and protrudes from a bottom surface of the trench. A topmost portion of the first bump is lower than the base, and a width of the first bump is larger than a width of each of the fin shaped structures.

In the semiconductor structure and the manufacturing method thereof according to the present invention, the fin shaped structures disposed in the predetermined region are removed for forming the trench recessed from the base of the substrate and the first bump protruding from the bottom surface of the trench. The topmost portion of the first bump is lower than the base, and the width of the first bump is larger than the width of each of the fin shaped structures. Accordingly, the trench and the first bump may be used to provide better isolation without causing any disturbance to elements formed subsequently.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIGS. 1-6 are schematic drawings illustrating a manufacturing method of a semiconductor structure according to an embodiment of the present invention, wherein FIG. 1 is a top view diagram, FIG. 2 is a cross-sectional diagram taken along a line A-A' in FIG. 1, FIG. 3 is a schematic drawing in a step subsequent to FIG. 2, FIG. 4 is a schematic drawing in a step subsequent to FIG. 3, FIG. 5 is a schematic drawing in a step subsequent to FIG. 4, and FIG. 6 is a schematic drawing in a step subsequent to FIG. 5.

DETAILED DESCRIPTION

To provide a better understanding of the present invention, preferred embodiments will be described in detail. The preferred embodiments of the present invention are illustrated in the accompanying drawings with numbered elements.

Figure 1:
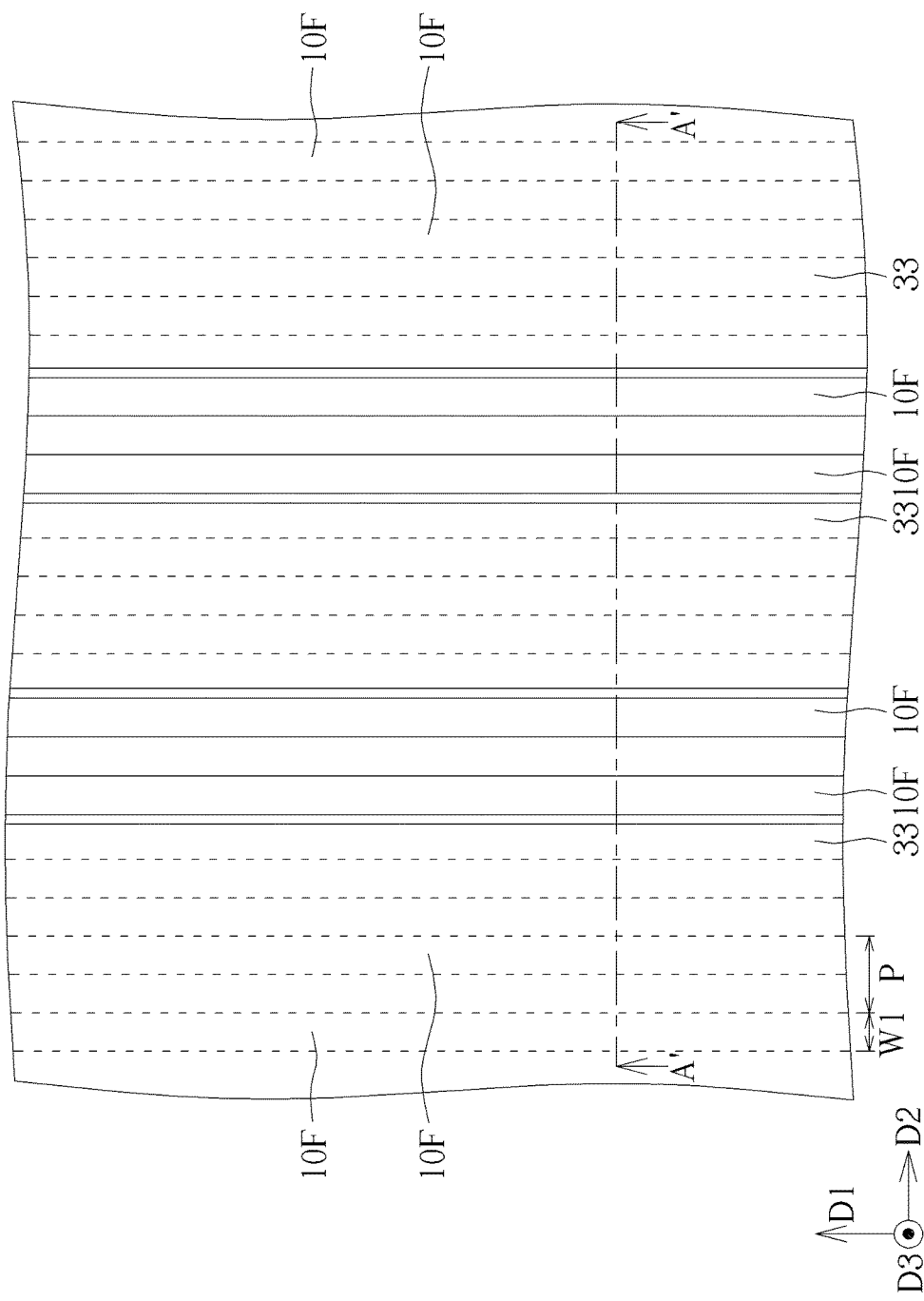
Figure 2:
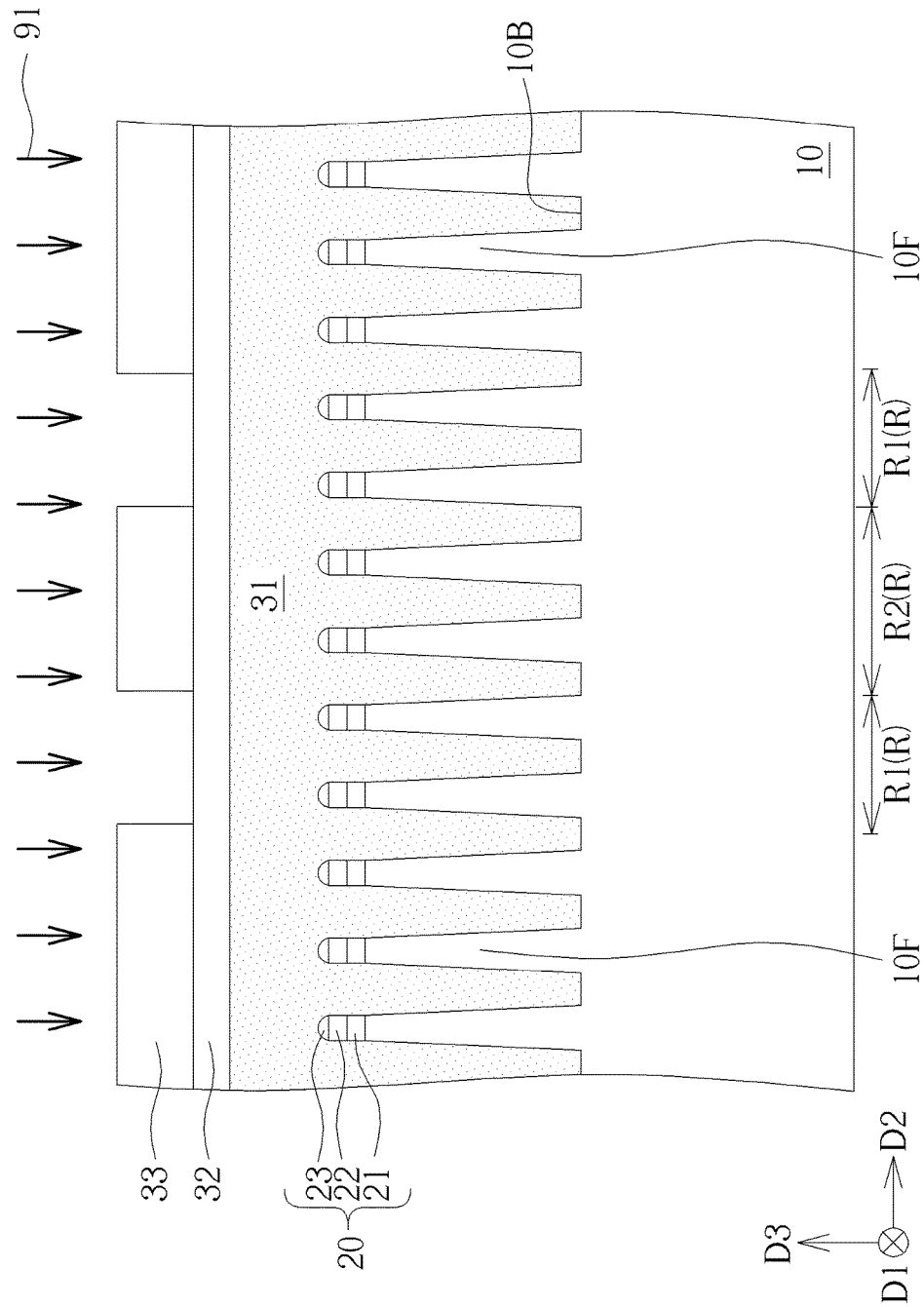

Please refer to FIGS. 1-6. FIGS. 1-6 are schematic drawings illustrating a manufacturing method of a semiconductor structure according to an embodiment of the present invention. The manufacturing method of the semiconductor structure in this embodiment includes the following steps. As shown in FIG. 1 and FIG. 2, a substrate 10 is provided. The substrate 10 has a base 10B, and a plurality of fin shaped structures 10F is formed on the base 10B of the substrate 10. The substrate 10 may include a semiconductor substrate such as a silicon substrate, an epitaxial substrate, a silicon carbide substrate, or a silicon-on-insulator (SOI) substrate, but not limited thereto. In some embodiments, the fin shaped structures 10F may be formed through a self-aligned double-patterning (SADP) process which is also known as a sidewall image transfer (SIT) process, but not limited thereto. The SADP process may include forming a plurality of patterned sacrificial mandrels (not shown in the drawings) on the substrate 10 by using a photolithography and an etching process, performing a depositing and an etching processes sequentially to form a spacer (not shown in the drawings) at sidewalls of each of the patterned sacrificial mandrels, and then removing the patterned sacrificial mandrels and performing another etching process by using the spacer as a mask, thereby transferring the patterns of the spacer to a patterned mask layer 20. The patterned mask layer 20 may be a single layer or a multiple layer structure. For example, the patterned mask layer 20 may include a nitride layer 21, an oxide layer 22, and a hard mask layer 23, but not limited thereto. Subsequently, another etching process may be performed to transfer the patterns of the patterned mask 20 to the substrate 10 underneath for defining the fin shaped structures 10F and the base 10B of the substrate 10. In some embodiments, the fin shaped structure 10F may have a closed rectangular frame before a fin cut process, and the fin shaped structures 10F may extend in a first direction D1 and be repeatedly arranged in a second direction D2 by a pitch P after the fin cut process. In some embodiments, the first direction D1 may be substantially perpendicular to the second direction D2, but not limited thereto. In some embodiments, the formation of the fin shaped structures 10F may also be accomplished by first forming a patterned hard mask (not shown in the drawings) on the substrate 10, and then performing an epitaxial process on the exposed substrate 10 through the patterned hard mask to form a semiconductor layer (not shown in the drawings), such as silicon or silicon germanium layer. The semiconductor layer may then be used as the corresponding fin shaped structure.

Figure 3:
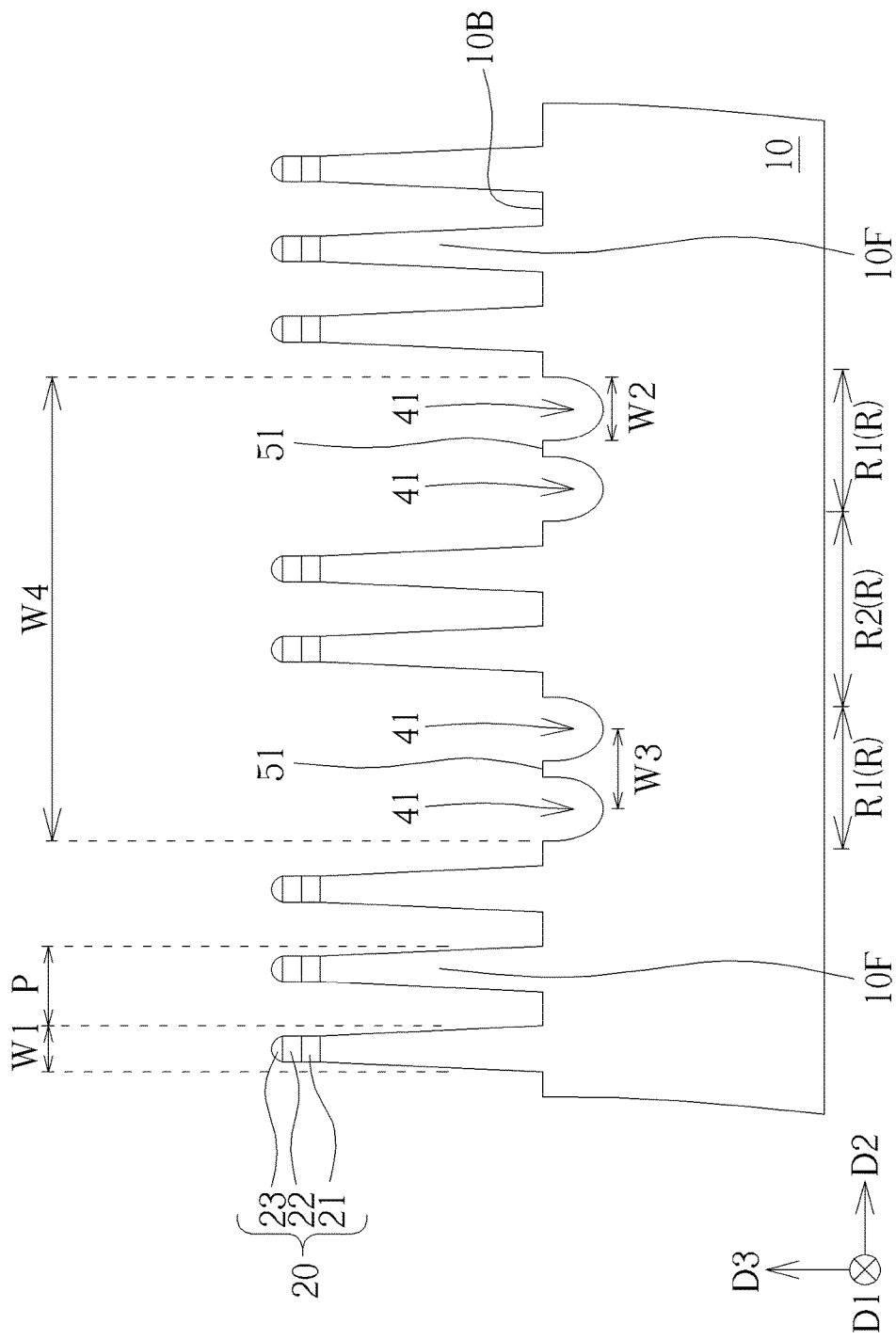

As shown in FIGS. 2-5, the fin shaped structures 10F in a predetermined region R may then be removed for forming a trench 40 and a first bump 50. The trench 40 is recessed from the base 10B of the substrate 10, and the first bump 50 is formed within the trench 40 and protrudes from a bottom surface of the trench 40. In some embodiments the step of removing the fin shaped structures 10F in the predetermined region R may include but is not limited to the following steps. As shown in FIG. 2 and FIG. 3, the predetermined region R may include a first region R1 and a second region R2. The first region R1 may be located at two opposite sides of the second region R2 in the second direction D2, but not limited thereto. A first etching process 91 may be performed for removing the fin shaped structures 10F in the first region R1. Before the first etching process 91, a first organic dielectric layer (ODL) 31 may be formed covering the substrate 10 and the fin shaped structures 10F, and a first mask layer 33, such as a photoresist layer, may be formed covering the first organic dielectric layer 31 outsides the first region R1. The first organic dielectric layer 31 may preferably include a sacrificial material having gap-filling ability and etching selectivity relative to the fin shaped structures 10F, so as to fill the space between the fin shaped structures 10F. In some embodiments, a first anti-reflecting layer 32, such as a silicon-containing hard mask bottom anti-reflecting coating (SHB) may be formed between the first mask layer 33 and the first organic dielectric layer 31, but not limited thereto.

In some embodiments, the first etching process 91 may include multiple etching steps, such as one or more dry etching steps and/or one or more wet etching steps, performed by using the first mask layer 33 as an etching mask, to remove the first organic dielectric layer 31 outside the first mask layer 33 and the fin shaped structures 10F in the first region R1. In some embodiments, a plurality of sub trenches 41 recessed from the base 10B of the substrate 10 by the first etching process 91, and each of the sub trenches 41 may be formed corresponding to the location of one of the fin shaped structures 10F in the first region R1. In other words, the fin shaped structures 10F in the first region R1 may be completely removed by the first etching process 91, and the sub trenches 41 may be formed by over etching of the first etching process 91. Accordingly, the number of the sub trenches 41 may be equal to the number of the removed fin shaped structures 10F in the first region R1, and a width of each of the fin shaped structures 10F in the second direction D2 (such as a first width W1 shown in FIG. 3) may be equal to or smaller than a width of each of the sub trenches 41 in the second direction D2 (such as a second width W2 shown in FIG. 3). In some embodiments, the second width W2 of each of the sub trenches 41 may be smaller than the pitch P of the fin shaped structures 10F, and the second width W2 may be larger than or equal to the first width W1 of each of the fin shaped structures 10F, but not limited thereto. Additionally, an etching selectivity between the first organic dielectric layer 31 and the fin shaped structures 10F in the first etching process 91 may be controlled for forming the sub trenches 41. For example, an etching rate of the fin shaped structures 10F and the substrate 10 may be higher than an etching rate of the first organic dielectric layer 31 in the first etching process 91. Accordingly, a plurality of bumps, such as second bumps 51 shown in FIG. 3, may be formed by the first etching process 91, and each of the second bumps 51 may be formed between the sub trenches 41 adjacent to each other in the second direction D2. Each of the second bumps 51 may be formed corresponding to a part of the substrate 10 disposed between the fin shaped structures 10F in the first region R1. Therefore, a topmost portion of each of the second bumps 51 may be lower than the base 10B of the substrate 10 in a vertical direction D3, and a width of each of the second bumps 51 (such as a third width W3 shown in FIG. 3) may be larger than the first width W1 of each of the fin shaped structures 10F. The vertical direction D3 may be regarded as a thickness direction of the substrate 10, but not limited thereto. The first mask layer 33, the first anti-reflecting layer 32, and the first organic dielectric layer 31 may be removed by the first etching process 91 and/or another removing process performed after the first etching process 91.

Figure 4:
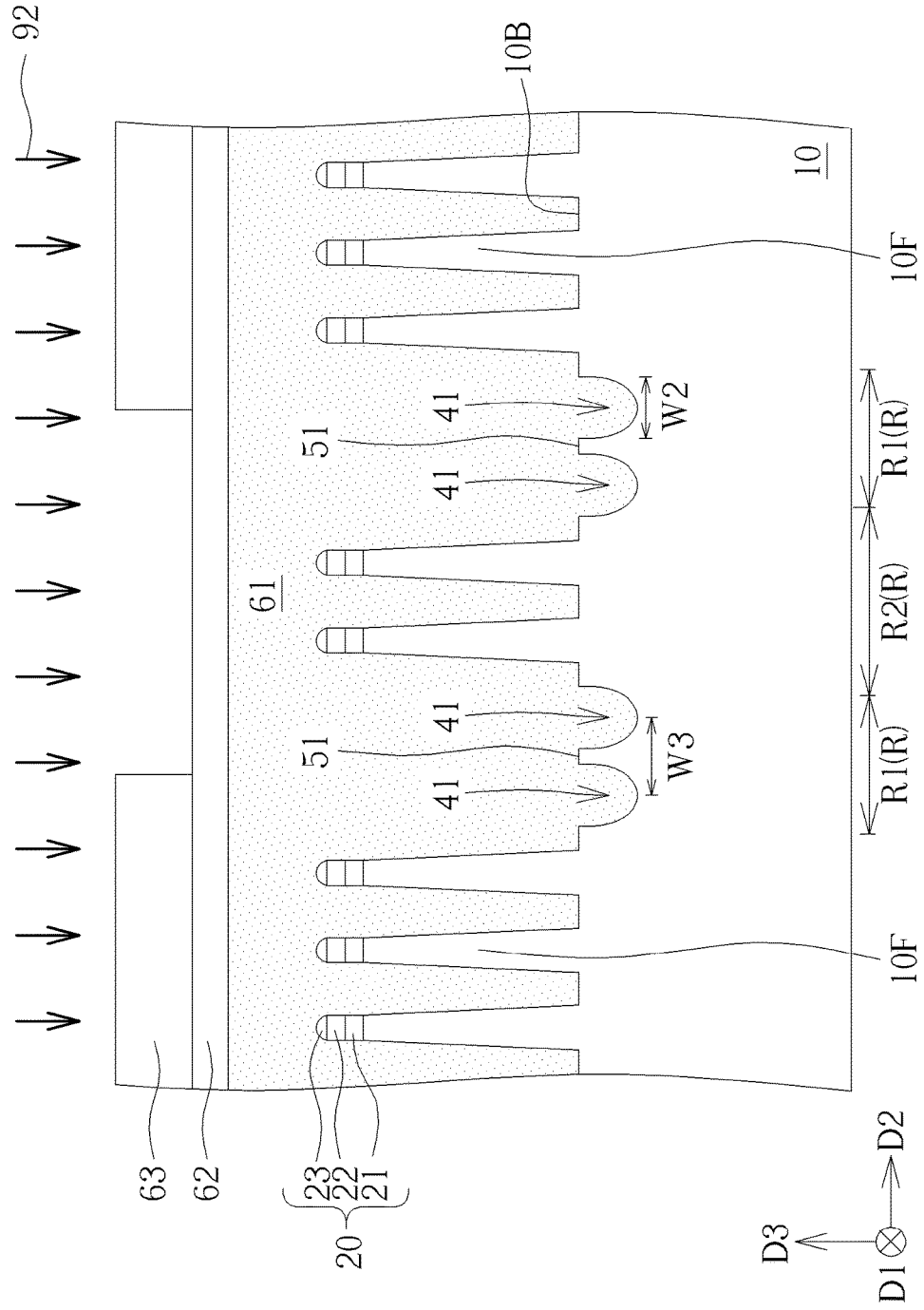
Figure 5:
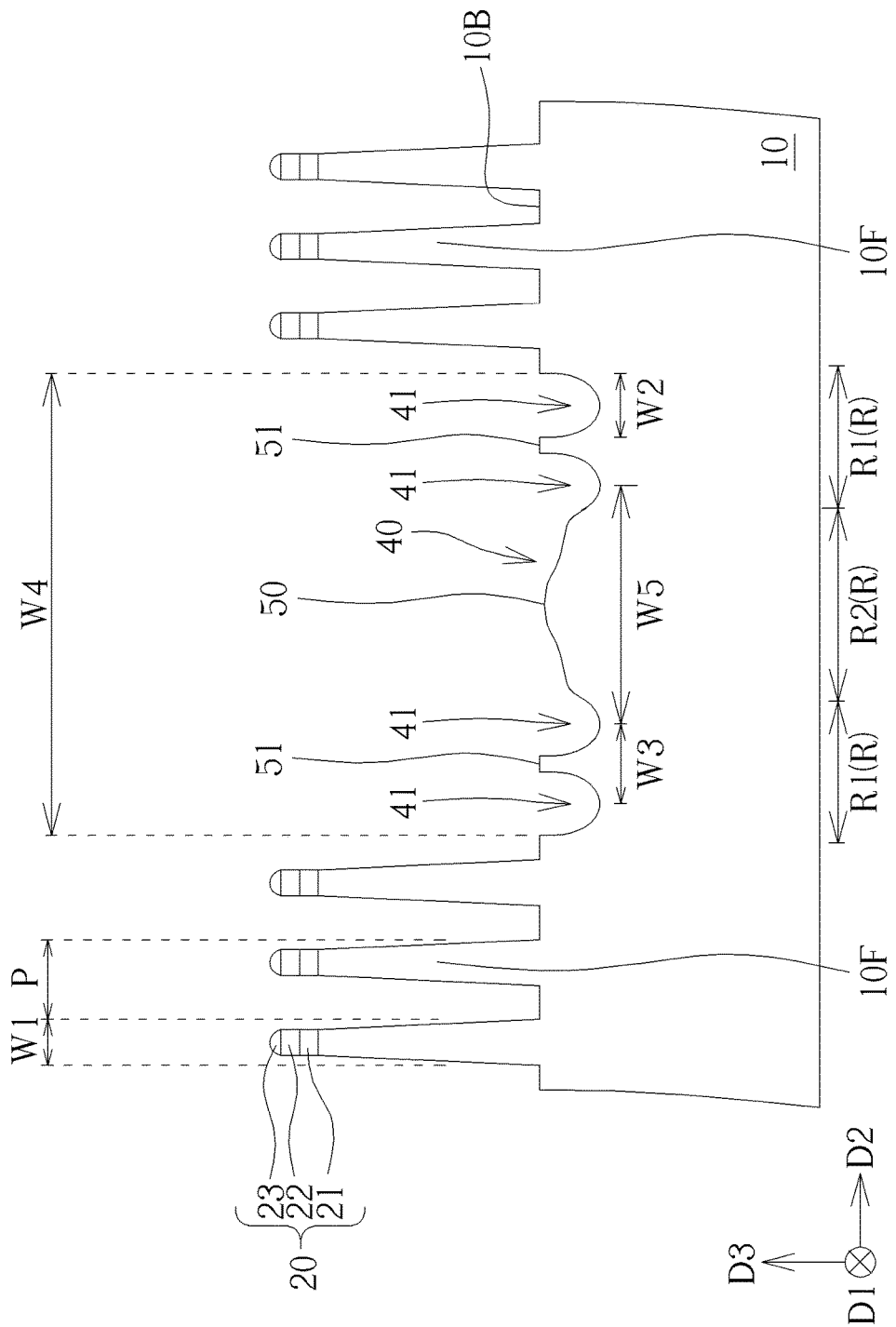

As shown in FIGS. 2-5, a second etching process 92 may be performed for removing the fin shaped structures 10F in the second region R2 after the first etching process 93. As shown in FIG. 4 and FIG. 5, before the second etching process 92, a second organic dielectric layer 61 may be formed covering the substrate 10, the fin shaped structures 10F, and the sub trenches 41, and a second mask layer 63, such as a photoresist layer, may be formed covering the second organic dielectric layer 61 outsides the predetermined region R. The material properties of the second organic dielectric layer 61 may be similar to those of the first organic dielectric layer mentioned above, but not limited thereto. In some embodiments, a second anti-reflecting layer 62 may be formed between the second mask layer 63 and the second organic dielectric layer 61, and material properties of the second anti-reflecting layer 62 may be similar to those of the first anti-reflecting layer mentioned above, but not limited thereto. In some embodiments, the second etching process 92 may also include multiple etching steps performed by using the second mask layer 63 as an etching mask, to remove the second organic dielectric layer 61 outside the second mask layer 63 and the fin shaped structures 10F in the second region R2. Accordingly, the trench 40 and the first bump 50 are formed after the second etching process 92. The trench 40 includes the sub trenches 41, and the trench 40 is formed corresponding to the predetermined region R. In some embodiments, there may be six or more fin shaped structures 10F disposed in the predetermined region R, and a width of the trench 40 in the second direction D2 (such as a fourth width W4 shown in FIG. 5) may be larger than five times the pitch P of the fin shaped structures 10F, but not limited thereto. The first bump 50 is formed in the second region R2 and formed by the second etching process 92, and the first bump 50 is formed at a location corresponding to the fin shaped structures 10F in the second region R2. In some embodiments, the fin shaped structures 10F in the second region R2 may be completely removed by the second etching process 92, and the first bump 50 may be formed by over etching of the second etching process 92.

Additionally, a topmost portion of the first bump 50 may be formed corresponding to a part of the substrate 10 disposed between the fin shaped structures 10F in the second region R2. Therefore, the topmost portion of the first bump 50 is lower than the base 10B of the substrate 10, a width of the first bump 50 (such as a fifth width W5 shown in FIG. 5) is larger than the first width W1 of each of the fin shaped structures 10F, and the third width W3 of each of the second bumps 51 is smaller than the fifth width W5 of the first bump 50. Additionally, the first bump 50 may be formed between the sub trenches 41 in the second direction D2, and the first bump 50 is also formed between the second bumps 51 in the second direction D2. Because there are more than one of the fin shaped structures 10F disposed in the second region R2, the fifth width W5 of the first bump 50 may be larger than the pitch P of the fin shaped structures 10F. In some embodiments, the spacing width between two adjacent fin shaped structures 10F may be substantially equal to the first width W1 of each of the fin shaped structures 10F, and the fifth width W5 of the first bump 50 may be larger than triple the first width W1 of each of the fin shaped structures 10F accordingly.

Figure 6:
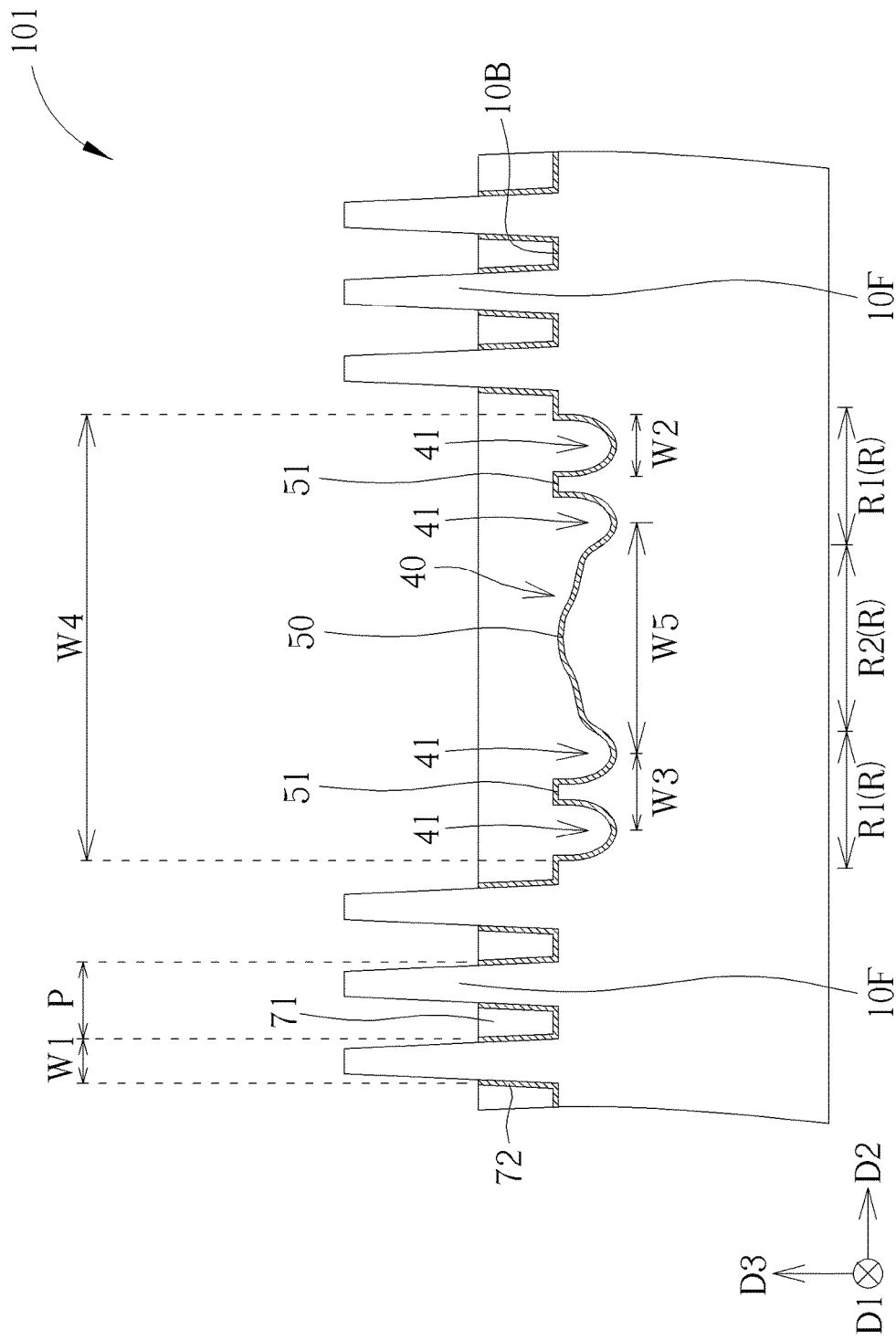

In some embodiments, the second etching process 92 may be regarded as the fin cut process mentioned above, and the first etching process described above may be regarded as a fin remove process, but not limited thereto. As shown in FIG. 5 and FIG. 6, a liner 71 and an insulation layer 72 are formed sequentially. The liner 71 may include a single layer structure or multilayer structure, and preferably includes silicon oxide or suitable high dielectric constant materials; the insulation layer 72 may include silicon oxide or other suitable insulation materials. The formations of the liner 71 and the insulation layer 72 may include firstly forming a dielectric material layer (not shown in the drawings) on the substrate 10 and the fin shaped structures 10F through an atomic layer deposition (ALD) process, forming an insulation material layer (not shown in the drawings) on the dielectric material layer through a chemical vapor deposition (CVD) process, such as a flowable chemical vapor deposition (FCVD) process, and then, performing a chemical mechanical polishing (CMP) process and an etching back process to remove a portion of the insulation material layer and a portion of the dielectric material layer, thereby forming the liner 71 and the insulation layer 72. The liner 71 and the insulation layer 72 only cover a bottom portion of the fin shaped structures 10F. In other words, a portion of the fin shaped structures 10F may protrude from the insulation layer 72, and the insulation layer 72 may be regarded as a shallow trench isolation (STI) surrounding the fin shaped structures 10F. Additionally, the patterned mask layer 20 formed on the fin structures 10F may be removed by the CMP process mentioned above, but not limited thereto.

As shown in FIG. 6, a semiconductor structure 101 may be formed by the manufacturing steps described above. The semiconductor structure 101 may include the substrate 10, the fin shaped structures 10F, the trench 40, and the first bump 50. The substrate 10 has the base 10B, and the fin shaped structures 10F protrude from the base 10B. The trench 40 is recessed from the base 10B of the substrate 10. The first bump 50 is disposed within the trench 40 and protrudes from a bottom surface of the trench 40. The topmost portion of the first bump 50 is lower than the base 10B in the vertical direction D3, and the fifth width W5 of the first bump 50 is larger than the first width W1 of each of the fin shaped structures 10F. In some embodiments, the trench 40 may be disposed between the fin shaped structures 10F in the second direction D2, and the trench 40 may include a plurality of the sub trenches 41 recessed from the base 10B. The second width W2 of each of the sub trenches 41 is smaller than the fourth width W4 of the trench 40. In some embodiments, the fourth width W4 of the trench 40 in the second direction D2 may be larger than five times the pitch P of the fin shaped structures 10F, but not limited thereto. The first bump 50 may be disposed between the sub trenches 41 in the second direction D2. The second width W2 of each of the sub trenches 41 may be smaller than the pitch P of the fin shaped structures 10F and larger than the first width W1 of each of the fin shaped structures 10F. The fifth width W5 of the first bump 50 may be larger than the pitch P of the fin shaped structures 10F. In some embodiments, the fifth width W5 of the first bump 50 may be larger than triple the first width W1 of each of the fin shaped structures 10F, but not limited thereto. In some embodiments, the semiconductor structure 101 may further include a plurality of the second bumps 51 disposed within the trench 40. The second bumps 51 protrude from the bottom surface of the trench 40, and each of the second bumps 51 may be disposed between the sub trenches 41. The topmost portion of each of the second bumps 51 is lower than the base 10B of the substrate 10 in the vertical direction, and the third width W3 of each of the second bumps 51 may be smaller than the fifth width W5 of the first bump 50. In some embodiments, the first bump 50 may be disposed between the second bumps 51 in the second direction D2. In some embodiments, the semiconductor structure 101 may further include the liner 71 and the insulation layer 72. The liner 71 and the insulation layer 72 cover the bottom portion of the fin shaped structures 10F. In other words, the top portion of each of the fin shaped structures 10F may protrude from the insulation layer 72. In some embodiments, each of the fin shaped structures 10F may be a semiconductor fin shaped structure and the semiconductor structure 101 may be used to form fin type field effect transistors, but not limited thereto.

To summarize the above descriptions, according to the semiconductor structure and the manufacturing method thereof in the present invention, the trench recessed from the base of the substrate and the first bump protruding from the bottom surface of the trench may be formed by removing the fin shaped structures disposed in the predetermined region. The topmost portion of the first bump is lower than the base, and the width of the first bump is larger than the width of each of the fin shaped structures. Accordingly, the trench and the first bump may be used to provide better isolation without causing any disturbance to elements formed subsequently.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor structure, comprising:
   a substrate having a base;
   a plurality of fin shaped structures protruding from the base;
   a trench recessed from the base of the substrate; and
   a first bump disposed within the trench and protruding from a bottom surface of the trench, wherein a topmost portion of the first bump is lower than the base, and a width of the first bump is larger than a width of each of the fin shaped structures.

2. The semiconductor structure according to claim 1, wherein the width of the first bump is larger than a pitch of the fin shaped structures.

3. The semiconductor structure according to claim 1, wherein the width of the first bump is larger than triple the width of each of the fin shaped structures.

4. The semiconductor structure according to claim 1, wherein the trench comprises a plurality of sub trenches, and the first bump is disposed between the sub trenches.

5. The semiconductor structure according to claim 4, wherein a width of each of the sub trenches is smaller than a pitch of the fin shaped structures and larger than the width of each of the fin shaped structures.

6. The semiconductor structure according to claim 1, further comprising a plurality of second bumps disposed within the trench and protruding from the bottom surface of the trench, wherein a topmost portion of each of the second bumps is lower than the base, and a width of each of the second bumps is smaller than the width of the first bump.

7. The semiconductor structure according to claim 6, wherein the first bump is disposed between the second bumps.

8. The semiconductor structure according to claim 6, wherein the trench comprises a plurality of sub trenches, and each of the second bumps is disposed between the sub trenches.

9. The semiconductor structure according to claim 1, wherein a width of the trench is larger than five times a pitch of the fin shaped structures.

10. The semiconductor structure according to claim 1, wherein the trench is disposed between the fin shaped structures.

11. A manufacturing method of a semiconductor structure, comprising:
    providing a substrate having a base and a plurality of fin shaped structures formed on the base; and
    removing the fin shaped structures in a predetermined region for forming:
        a trench recessed from the base of the substrate; and
        a first bump within the trench and protruding from a bottom surface of the trench, wherein a topmost portion of the first bump is lower than the base, and a width of the first bump is larger than a width of each of the fin shaped structures.

12. The manufacturing method according to claim 11, wherein the predetermined region comprises a first region and a second region, and the step of removing the fin shaped structures in the predetermined region comprises:
    performing a first etching process for removing the fin shaped structures in the first region; and
    performing a second etching process for removing the fin shaped structures in the second region after the first etching process.

13. The manufacturing method according to claim 12, wherein the first region is located at two opposite sides of the second region.

14. The manufacturing method according to claim 12, further comprising:
    forming a plurality of sub trenches recessed from the base of the substrate by the first etching process, wherein the first bump is formed between the sub trenches.

15. The manufacturing method according to claim 14, wherein a width of each of the sub trenches is smaller than a pitch of the fin shaped structures and larger than the width of each of the fin shaped structures.

16. The manufacturing method according to claim 14, further comprising:
    forming a plurality of second bumps by the first etching process, wherein each of the second bumps is formed between the sub trenches, and the first bump is formed between the second bumps.

17. The manufacturing method according to claim 16, wherein a topmost portion of each of the second bumps is lower than the base, and a width of each of the second bumps is smaller than the width of the first bump.

18. The manufacturing method according to claim 12, wherein the first bump is formed in the second region and formed by the second etching process.

19. The manufacturing method according to claim 11, wherein the width of the first bump is larger than a pitch of the fin shaped structures.

20. The manufacturing method according to claim 11, wherein the width of the first bump is larger than triple the width of each of the fin shaped structures.

* * * * *